(12) United States Patent
Ito

(10) Patent No.: US 7,732,265 B2
(45) Date of Patent: Jun. 8, 2010

(54) THIN FILM TRANSISTOR, METHOD FOR MANUFACTURING THE SAME AND FILM FORMATION APPARATUS

(75) Inventor: Manabu Ito, Tokyo (JP)

(73) Assignee: Toppan Printing Co., Ltd. (JP)

(*) Notice: Subject to any disclaimer, the term of this patent is extended or adjusted under 35 U.S.C. 154(b) by 0 days.

(21) Appl. No.: 12/132,511

(22) Filed: Jun. 3, 2008

(65) Prior Publication Data

US 2009/0294808 A1 Dec. 3, 2009

(51) Int. Cl.
*H01L 21/00* (2006.01)
*H01L 21/84* (2006.01)

(52) U.S. Cl. .................. 438/158; 438/149; 438/151; 257/E21.414

(58) Field of Classification Search .............. 438/149, 438/151, 158–159; 257/E21.414–E21.415
See application file for complete search history.

(56) References Cited

U.S. PATENT DOCUMENTS

2003/0173890 A1* 9/2003 Yamazaki et al. ........... 313/498

OTHER PUBLICATIONS

Nomura, Kenji et al., "Room-temperature fabrication of transparent flexible thin-film transistor using amorphous oxide semiconductors", *Nature*, Nov. 25, 2004, pp. 488-492.

* cited by examiner

*Primary Examiner*—Savitri Mulpuri
*Assistant Examiner*—Calvin Choi
(74) *Attorney, Agent, or Firm*—Squire, Sanders & Dempsey L.L.P.

(57) ABSTRACT

One embodiment of the present invention is a method for manufacturing a bottom gate type thin film transistor having a gate electrode, a gate insulating film, an oxide semiconductor active layer, a source electrode and a drain electrode on a flexible plastic substrate of a supporting substrate, the method including continuously forming the gate insulating film and the oxide semiconductor active layer on the flexible plastic substrate with the gate electrode inside a vacuum film formation chamber of a film formation apparatus, the apparatus being a type of winding up continuously the roll-shaped substrate, and the gate insulating film and the oxide semiconductor active layer formed without being exposed to air.

7 Claims, 2 Drawing Sheets

THIN FILM TRANSISTOR, METHOD FOR MANUFACTURING THE SAME AND FILM FORMATION APPARATUS

BACKGROUND OF THE INVENTION

1. Field of the Invention

The present invention is related to a thin film transistor having an active layer of an oxide semiconductor, a method for manufacturing the transistor and a film formation apparatus.

2. Description of the Related Art

In general, a thin film transistor using an amorphous silicon film, a polysilicon film or the like has been used for a transistor for driving an electric device. However, for forming a high quality amorphous silicon or polysilicon film it is necessary to have a temperature of 200 degrees Celsius or more during film formation. Therefore, it was difficult to obtain a flexible device which used an inexpensive polymer film as a supporting substrate.

In recent years, research and development into thin film transistors using an organic semiconductor material has been actively performed. As for an organic semiconductor material, a film can be formed by a printing process without using a vacuum process. Therefore, significant cost reductions may be possible. Further, there is a merit in which an organic semiconductor material can be formed on a supporting substrate such as a flexible plastic substrate. However, electron mobility of an organic semiconductor material is too low. Further, there is a demerit in which time degradation such as a poor quality resistance occurs in an organic semiconductor material. Therefore, an organic semiconductor has not yet been practically used in various fields.

From the above-mentioned reason, recent interest has focused on a transparent oxide semiconductor. As for a transparent oxide semiconductor, if it is manufactured at a low temperature, it has a high electron mobility. Besides, if a substrate, an electrode and an insulating film which are transparent are used, a transparent device is obtained. Further, the transparent oxide semiconductor is a material having new characteristics which conventional materials do not have. As a transparent oxide semiconductor, for example, a field-effect transistor using an amorphous In—Ga—Zn—O material has been proposed. Nomura et al. succeeded in forming a transparent field-effect transistor on a PET substrate at a room temperature, the transistor having a good property of mobility of about 10 $cm^2/Vs$, by using an amorphous oxide semiconductor using the above-mentioned material as a semiconductor active layer. (See non-patent document 1.)

A thin film transistor using an oxide is manufactured by a vacuum process. Therefore, there is a problem in which costs of an apparatus are high compared with that of an organic semiconductor. Especially, in the case of a conventional batch type film formation apparatus, many vacuum film formation chambers are necessary. Therefore, costs of an apparatus are very high. Besides, there is a problem in which productivity is low.

In addition, in a field-effect transistor, controlling an interface between a semiconductor active layer and an insulating film is very important. It is known that characteristics of a transistor are lowered in the case where an interface between a semiconductor active layer and an insulating layer is contaminated.

Thus, the inventor tried to solve the problems such as controlling an interface of a conventional thin film transistor, low productivity and high apparatus costs. The present invention provides a method for manufacturing a bottom gate transistor having a gate electrode, a gate insulating film, an oxide semiconductor active layer, a source electrode and a drain electrode on a supporting material, including continuously forming a gate insulating film and an oxide semiconductor active layer without exposing it to air. According to the present invention, a clean interface between a gate insulating film and a semiconductor active layer without contamination is realized, and a thin film transistor having good characteristics can be provided.

A known document is described below.

[Non-patent document 1] K. Nomura et al. Nature, 432, 488 (2004)

SUMMARY OF THE INVENTION

One embodiment of the present invention is a method for manufacturing a bottom gate type thin film transistor having a gate electrode, a gate insulating film, an oxide semiconductor active layer, a source electrode and a drain electrode on a flexible plastic substrate of a supporting substrate, the method including continuously forming the gate insulating film and the oxide semiconductor active layer on the flexible plastic substrate with the gate electrode inside a vacuum film formation chamber of a film formation apparatus, the apparatus being a type of continuously winding up the roll-shaped substrate, and the gate insulating film and the oxide semiconductor active layer formed without being exposed to air.

Another embodiment of the present invention is a film formation apparatus for forming a gate insulating film and an oxide semiconductor active layer of a bottom gate type thin film transistor having a gate electrode, the gate insulating film, the oxide semiconductor active layer, a source electrode and a drain electrode on a flexible plastic substrate, the film formation apparatus used for a method for manufacturing a thin film transistor according to claim 1, the apparatus including a vacuum film formation chamber and a film formation roll inside the vacuum film formation chamber, the gate insulating film and the oxide semiconductor active layer continuously formed in the vacuum film formation chamber while the roll-shaped flexible plastic substrate is held on a surface of one film formation roll inside the vacuum film formation chamber and the film formation roll is rotated at a constant speed.

In these drawings, 1 is an un-winding roll; 2 is a flexible plastic substrate with a gate electrode; 3 is a wind-up roll; 4 is a film formation roll; 5 is an insulating layer formation chamber; 6 is an insulating film formation sputter target; 7 is a semiconductor layer formation chamber; 8 is a semiconductor layer formation sputter target; 9 is a parting plate; 10 and 11 are both parting plates; 12 is a wind-up type vacuum film formation apparatus; 21 is a flexible plastic substrate; 22 is a gate electrode; 23 is an auxiliary capacitor electrode; 24 is a gate insulating film; 25 is an oxide semiconductor active layer; 26 is a pixel electrode; 27 is a drain electrode; 28 is a source electrode; and 29 is a protective film.

DETAILED DESCRIPTION OF THE INVENTION

Hereinafter, a thin film transistor, a method for manufacturing the thin film transistor and a film formation apparatus are described based on one embodiment.

Figure 1:
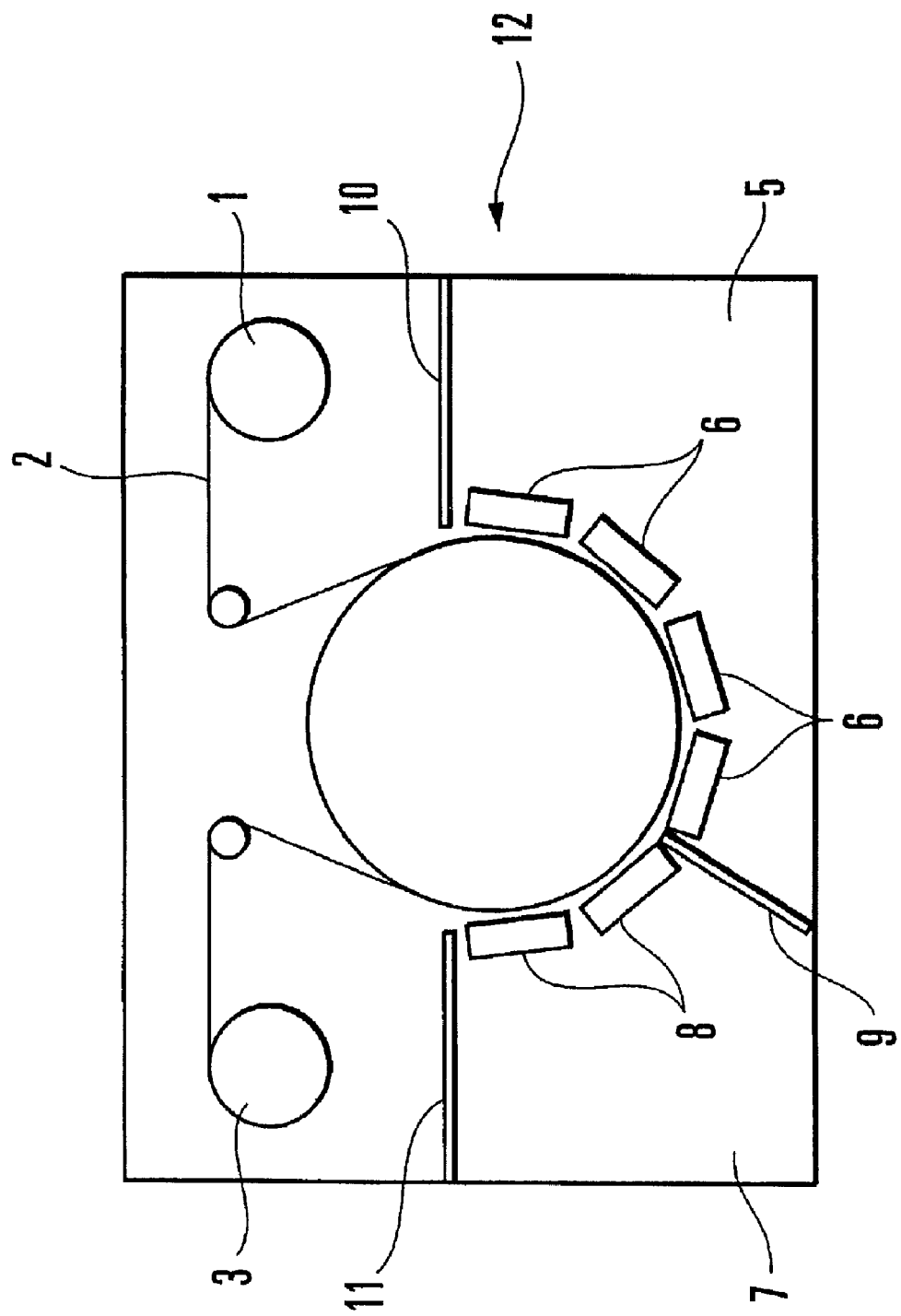
FIG. 1 is a side cross-sectional view of one example of a film formation apparatus of the present invention.

One embodiment of the present invention is described referring to figures. However, the present invention is not limited to these. FIG. 1 is an enlarged partial schematic diagram showing a film formation apparatus used for manufacturing a thin film transistor of the present invention.

FIG. 1 is a vacuum film formation apparatus used for forming a gate insulating film and an oxide semiconductor active layer in the present invention. The vacuum film formation apparatus includes a vacuum film formation chamber and devices for sending and winding up a substrate, the devices being arranged in the chamber. The devices include an un-winding roll 1 for sending a substrate, a film formation roll 4 and a winding-up roll 3. The supporting substrate is sent from an un-winding roll 1, thereafter, the substrate is sent to the film formation roll 4. Next, the substrate is wound by the winding-up roll 3 after the substrate is continuously moved according to a rotation of the film formation roll 4. The temperature of the film formation roll can be controlled. The film formation roll can be heated or cooled according to the kind of substrate or film to be formed. It is desirable that, after forming a gate insulating film, an oxide semiconductor active layer be continuously formed on the gate insulating film while no object touches a surface of the gate insulating film.

In a film formation apparatus as shown in FIG. 1, a sending/winding-up part is parted from a vacuum film formation chamber by parting plates 10, 11. The vacuum film formation chamber is parted by a parting plate 9. A front part of the vacuum film formation chamber is an insulating film formation chamber 5, and a back part of the vacuum film formation chamber is a semiconductor layer formation chamber 7. In the insulating film formation chamber 5, an insulating film formation sputter target 7 is placed so that the film formation roll 4 faces the target 7. In the semiconductor layer formation chamber 7, a semiconductor layer formation sputter target 8 is placed so that the film formation roll 4 faces the target 8.

Sputter method, pulsed laser deposition, vacuum evaporation deposition method, CVD (Chemical Vapor Deposition) method, MBE (Molecular Beam Epitaxy) method and the like are used for film formations of a gate insulating film and a semiconductor active layer. However, sputter method is preferred. If sputter method is used, a high quality device has a high productivity can be provided.

A sputter gas used for the present invention is ionized. The ionized sputter gas is hit against a target material. Material atom of the target is sputtered as a particle. As a sputter gas, in general, a rare gas such as argon is frequently used. It is desirable that a reactive gas such as oxygen, ozone, nitrogen, NOx, $CO_2$ and a mixed gas thereof be used at an optimized condition such as a flow rate or a gas pressure so that a gate insulating film and a metal oxide semiconductor have desirable composition ratios and desirable molecular structures. In addition, these reactive gases may be diluted by a rare gas etc.

A sputter type used for the present invention may be any type. For example, as for a power source type, DC (direct current), RF (radio frequency), MF (middle frequency), pulse or the like can be used. As for magnetic field, there are a magnetron sputter type and other types. In addition, as for the number of cathodes, there are a single cathode type and a dual cathode type. It is important that the most suitable type be selected, and be used.

A sputter type film formation apparatus of the present invention is a sputter film formation apparatus in which a thin film is formed on a substrate. The film formation mechanism in the film formation apparatus is described below. Plasma ions of a rare gas hit a target placed on a film formation chamber in an extremely low pressure gas. At this time, atomic particles of a target fly apart into a vacuum from a surface of a target by the collision of ions. The flying atomic particles are attached to a surface of an object. A thin film is formed by these processes.

In addition, film formation mechanism of another embodiment of the apparatus is described below. Targets 6, 8 are placed in a film formation chamber of an extremely low pressure gas of, for example, $10^{-0}$-$10^{-3}$ Pa, the low pressure chamber being made by a vacuum pump. Plasma ions of a rare gas hit the targets. Atoms fly apart into gases from surfaces of the targets. The apparatus has means for applying a voltage. That is, the apparatus has means for adjusting conditions such as a voltage and a current. Therefore, the atoms have sufficient energies. Thereby, the atoms are attached to a surface of an object near the atoms.

It is desirable that a plurality of targets for a gate insulating film formation and a plurality of targets for a semiconductor layer formation be used in view of a film formation rate (deposition rate) or a film thickness. Especially, in a process where a gate insulating film and an oxide semiconductor active layer for the present invention are formed, it is often the case that a film thickness of a gate insulating film is thick and a film formation rate is slow. Therefore, in general, the number of targets for a gate insulating film formation is more than the number of targets for a semiconductor layer formation. However, embodiments of the present invention are not limited to this.

In a film formation apparatus of the present invention, it is desirable that a gate insulating film formation chamber and a semiconductor layer formation chamber be spatially parted by a parting plate etc. In this case, a parting plate should part a gate insulating film formation chamber and a semiconductor layer formation chamber so that a gas supplied to one chamber does not influence another chamber. In addition, it is desirable that a film formation chamber, an unwinding roll chamber and a winding-up roll chamber be parted by parting plates. In this case, a gap between a parting plate and a film formation roll is sufficiently wide for a substrate to pass through.

In a film formation apparatus of the present invention, it is desirable that an insulating film formation chamber and a semiconductor layer formation chamber have respectively independent exhaust systems. If these chambers have independent exhaust systems, a gate insulating film and a semiconductor layer can be respectively formed at different conditions such as optimization of different gas pressures.

For an oxide semiconductor material used for an oxide semiconductor layer in the present invention, zinc oxide, indium oxide, tin oxide, tungsten oxide and zinc oxide gallium indium which are oxides including one or more elements among zinc, indium, tin, tungsten, magnesium and gallium can be used, but usable materials are not limited to these materials. Structures of these materials may be any of monocrystal, polycrystal, crystallite, mixed crystal of crystal/amorphous, nanocrystal scatter amorphous and amorphous. As for the film thickness of a semiconductor layer, it is preferably equal to or more than 20 nm.

For a source electrode, a drain electrode and a gate electrode which are elements of a bottom gate type thin film transistor of the present invention, gold, platinum, silver, palladium, copper, aluminium, nichrome, chromium, titanium, indium, indium oxide, zinc oxide, tin oxide, cadmium oxide, gallium oxide and a conductive polymer can be used. The respective electrodes are formed by vacuum evaporation method, ion plating method, sputter method, laser ablation method, plasma CVD technique, photo-CVD, hot wire CVD method. In addition, the respective electrodes are formed by screen printing, letterpress printing, intaglio printing and lithography using a conductive paste. When transparent conducting oxide such as indium oxide, zinc oxide and tin oxide is used, it is desirable that conductivity of a transparent conductive film be increased by mixing dopant. For example, it is desirable that zinc oxide is retracted by mixing gallium, aluminium, boron or the like, and that tin oxide is retracted by mixing fluorine, antimony or the like, and that indium oxide is retracted by mixing tin, zinc, titanium, cerium, hafnium, zirconia or the like. In addition, for increasing production efficiency, it is desirable that only dopant concentration is increased by using an electrode material which is the same material as the mother material of an oxide semiconductor. Film thickness of an electrode has to be at least equal to or more than 10 nm. In addition, materials of a gate electrode, a source electrode and a drain electrode may be identical to or different from each other.

A flexible plastic substrate used for the present invention may be transparent or may be opaque. However, if the substrate is used for a thin film transistor for a transmission type display, the substrate is preferably transparent. For example, polymethyl methacrylate, acrylics, polycarbonate, polystyrene, polyethylen sulfide, polyethersulfone, polyolefin, polyethylene terephthalate, polyethylenenaphthalate, cyclo-olefin polymers, polyether sulfone, triacetylcellulose, polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, polyimide, transparent polyimide, fluorinated resin, cyclic polyolefin resin and poly acrylic resin can be used. However, the substrate is not limited to these. A substrate comprising only one material among the above mentioned materials can be used, but a composite substrate comprising two or more materials among the above mentioned materials can be used. It is desirable that a transparent or opaque gas barrier film be formed on one side or both sides of the substrate.

An insulating material used for an insulating layer of the present invention is not especially limited. However, silicon oxide, silicon nitride, aluminium oxide, tantalum oxide, yttria, hafnium oxide, hafnium aluminates, oxidation zirconia, titanium oxide, polyethylene terephthalate, polyethylenenaphthalate, polypropylene, cyclo-olefin polymer, polyamide, polyether sulfone, polymethyl methacrylate, polycarbonate, polyalylate, polyethylen, polystyrol, teflon (registered mark), ebonite and epoxy can be used. In order to control a leak current between metal electrodes, electrical resistivity of insulating materials is preferably equal to or more than $10^{12}$ ($\Omega \cdot cm$).

A thin film transistor including an oxide semiconductor of the present invention can be used for devices such as a liquid crystal display, an organic EL display, an optical writing type cholesteric liquid crystal type display, twisting ball type display, a toner display type display, a movable film type display and a sensor.

Figure 2:
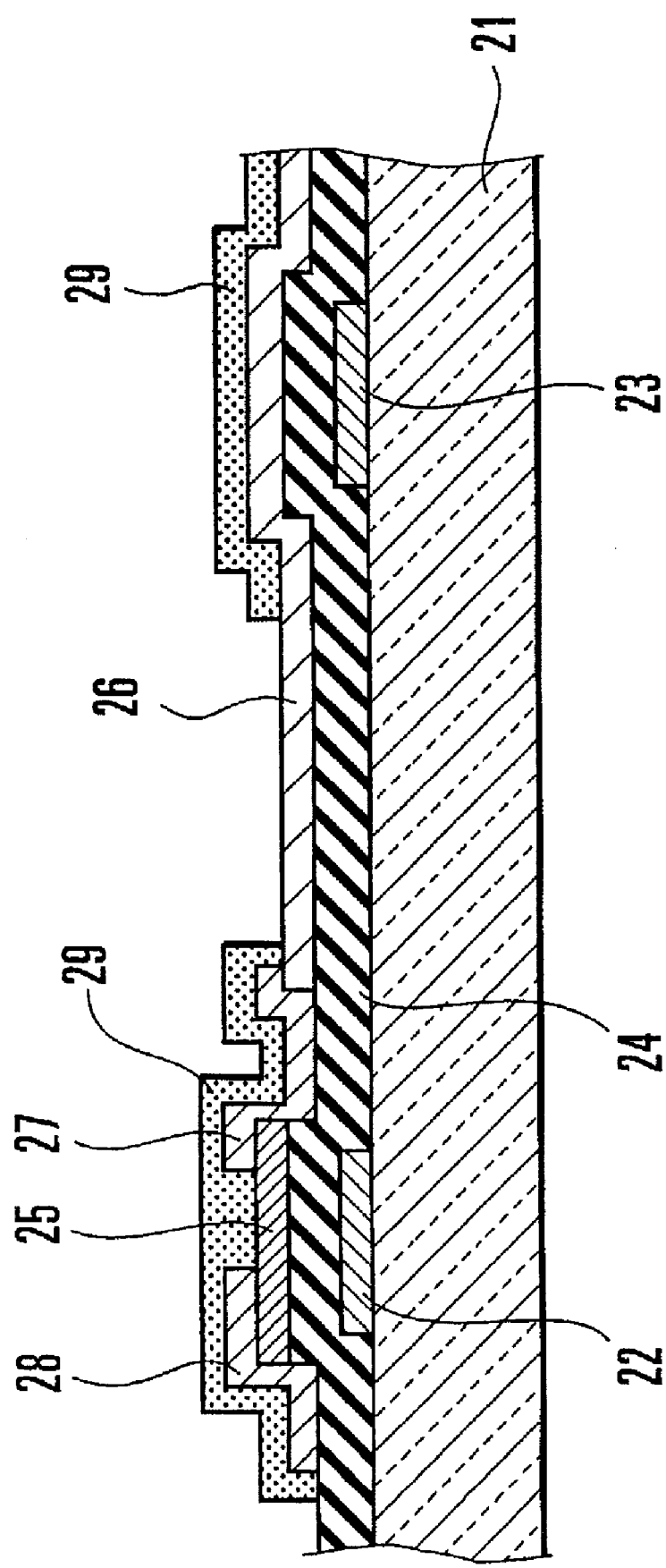
FIG. 2 is a side cross-sectional view of one example of a bottom gate type transistor manufactured by a film formation method in the present invention.

FIG. 2 is a side cross-sectional partial enlarged view of a layer structure of a thin film transistor of the present invention.

A thin film transistor shown in FIG. 2 is described below. A gate electrode 22, an auxiliary capacitor electrode 23 and the like are formed on a flexible plastic substrate 21 which is a supporting substrate. A masking thin film is formed on part of the flexible plastic substrate 21. Thereafter, a gate insulating film 24 and an oxide semiconductor active layer 25 are formed. A pixel electrode 26, source electrode 28 and a drain electrode 27 are formed. A protective film 29 for protecting inside elements is formed. In addition, patterning of a gate electrode 22, an auxiliary capacitor electrode 23, an oxide semiconductor active layer 25, a pixel electrode 26, a source electrode, a drain electrode and a protective film 29, is performed by, for example, an etching processing of photolithography method. Thereby, the respective patterns are formed.

If the manufacturing method and the film formation apparatus of the present invention are used, costs of a film formation apparatus are reduced and a thin film transistor without contamination at an interface between an insulating film and a semiconductor layer can be manufactured wherein productivity is high.

A method for manufacturing a bottom gate type thin film transistor including a gate electrode, a gate insulating film, an oxide semiconductor active layer, a source electrode and a drain electrode formed on a flexible plastic substrate, the method being a present invention, is used. A gate insulating film and an oxide semiconductor active layer are continuously formed without being exposed to air. Then, a thin film transistor of good characteristics can be obtained in which productivity is high. When a thin film transistor has a bottom gate type structure, an oxide semiconductor layer can be formed on a gate insulating film wherein patterning of the gate insulating film is not necessary. Therefore, a gate insulating film and a semiconductor active layer can be continuously manufactured without being exposed to air. Control of an interface between a gate insulating film and a semiconductor active layer is very important.

A bottom gate type thin film transistor manufactured by a method for manufacturing a bottom gate type thin film transistor of the present invention has the following merits: a gate insulating film and a semiconductor active layer are continuously formed on one film formation roll using a flexible substrate; thereby, low cost mass production is possible and a clean interface between a gate insulating film and a semiconductor active layer can be realized compared with a conventional batch type.

A method for manufacturing a thin film transistor of the present invention is a method for manufacturing a bottom gate type thin film transistor having a gate electrode, a gate insulating film, an oxide semiconductor active layer, a source electrode and a drain electrode formed on a flexible plastic substrate. This method includes a step of continuously forming a gate insulating film and an oxide semiconductor active layer without being exposed to air. Productivity of this method is high. If a gate insulating film and an oxide semiconductor active layer is continuously manufactured without being exposed to air, contamination between a gate insulating film and a semiconductor active layer can be prevented.

In a method for manufacturing a thin film transistor, a gate insulating film and an oxide semiconductor active layer can be formed by a sputter method. Therefore, productivity is high. Further, a large-area uniform device thin film can be formed. If both a gate insulating film and a semiconductor active layer are formed by a sputter method, costs of a film formation apparatus can be significantly reduced. Further, a manufacturing method with a high productivity can be realized.

In a film formation apparatus used for a method for manufacturing a thin film transistor of the present invention, film formation chambers for forming a gate insulating film and a semiconductor active layer comprised of an oxide are parted by a parting plate etc. Therefore, the film formation chambers have independent respective exhaust systems. Thereby, a gate insulating film and a semiconductor active layer can be formed at the same time at arbitrary different conditions in a gas pressure or a reactive gas type.

In a film formation apparatus used for a method for manufacturing a thin film transistor of the present invention, a gate insulating film and a semiconductor active layer comprised of an oxide are formed on one film formation roll. These elements are sequentially formed on the one film formation roll. Thereby, costs for the apparatus can be significantly reduced. In addition, contamination between a gate insulating film and a semiconductor active layer in film formation steps can be prevented.

Examples are described referring to FIG. 1. However, the present invention is not limited to these.

EXAMPLE 1

FIG. 1 is a cross-sectional diagram of a film formation apparatus of the present invention. FIG. 2 is a cross-sectional diagram of an example of a thin film transistor manufactured by a method of the present invention. At first, a thin film of a gate electrode 22 of aluminum was deposited on a PET substrate 21 to 50 nm. Etching of the thin film was performed by a photolithography method in order to form a thin film with a predetermined shape. Subsequently, a substrate with a gate electrode 22 is set on an un-winding roll part 1 in a sputter apparatus shown in FIG. 1. Here, taking-out part of a scanning electrode and a signal electrode was covered by forming a masking thin film of a resist in order to prevent an insulating layer and a semiconductor layer from covering the taking-out part of the scanning electrode and the signal electrode. A film formation apparatus of a sputter method included an un-winding roll 1 for sending a PET substrate and a winding-up roll 3. A film formation chamber for forming a film included an insulating film formation chamber 5 and a semiconductor layer formation chamber 7, both chambers being parted by a parting plate 9. An insulating film formation chamber 5 included four targets 6 comprised of a sintered body of SIN. A semiconductor layer formation chamber 7 included two targets 8 comprised of a sintered body of ZnO without an impurity for doping. Respective targets were connected to a RF power source. In addition, respective vacuum film formation chambers were exhausted by independent turbo-molecular pumps. Exhaust of $10^{-3}$ Pa or less was possible. Table 1 shows the conditions of film formation of the respective layers.

TABLE 1

| | | Name of film | |
|---|---|---|---|
| item | unit | Gate insulating film | Semiconductor active layer |
| Target | | sintered body of SIN | sintered body of ZnO |
| Temperature of a substrate | Degrees Celsius | 40 | 40 |

TABLE 1-continued

| | | Name of film | |
|---|---|---|---|
| item | unit | Gate insulating film | Semiconductor active layer |
| Operating pressure | Pa | 0.5 | 0.5 |
| Flow rate of a gas | Ar SCCM | 40 | 19.7 |
| | $O_2$ SCCM | 20 | 0.3 |
| Input power | W | 500 | 350 |
| Film thickness | nm | 280 | 40 |

In addition, a temperature of a substrate shown in this table was a controlled temperature of a film formation roll of a film formation apparatus.

Respective gases were supplied by tanks, and were introduced to film formation chambers through a mass flow controller. Predetermined gases were respectively introduced into an insulating film formation chamber 5 and a semiconductor layer formation chamber 7. An aperture ratio of a main valve was adjusted by an automatic pressure controller so that the pressure became a predetermined pressure. Thereafter, electric discharge was performed. A substrate with a gate electrode 22 was supplied from an un-winding roll 1 to an insulating film formation chamber 5 at a substrate speed of 2 m/minute. Thereby, a gate insulating film 24 was continuously formed and subsequently a semiconductor active layer 25 was continuously formed in a semiconductor layer formation chamber 7.

A substrate 21 with a gate insulating film 24 and a semiconductor active layer 25 was removed from a winding-up roll 3. Thereafter, etching of a semiconductor active layer 25 was performed by a photolithography method in order to form a predetermined-shaped pattern. Subsequently, a source electrode 28 and a drain electrode comprised of ITO were formed by a sputter method by liftoff. Thereby, a source electrode 28 and a drain electrode 27 of predetermined shapes were formed. Finally, a protective film 29 comprised of SiN was formed by a sputter method. In this way, a bottom gate type thin film transistor of the present invention was manufactured.

(The disclosure of Japanese Patent Application No. JP 2005-345455, filed on Nov. 30, 2005, is incorporated herein by reference in its entirety.)

What is claimed is:

1. A method for manufacturing a bottom gate type thin film transistor having a gate electrode, a gate insulating film, an oxide semiconductor active layer, a source electrode and a drain electrode on a flexible plastic substrate of a supporting substrate, comprising:

continuously forming the gate insulating film and the oxide semiconductor active layer on the flexible plastic substrate with the gate electrode inside a vacuum film formation chamber of a film formation apparatus, the apparatus being a type of continuously winding up the roll-shaped substrate, and the gate insulating film and the oxide semiconductor active layer formed without being exposed to air, arranging the flexible plastic substrate on a film formation roll in the vacuum film formation chamber, and forming the gate insulating film and the oxide semiconductor active layer on the film formation roll, wherein the gate insulating film and the oxide semiconductor active layer are formed in this order with the film formation roll rotated, wherein targets for the gate insulating film and targets for the semiconductor active layer respectively have a plurality of targets, and wherein the number of the targets for the gate insulating film is more than the number of the targets for the semiconductor active layer.

2. The method for manufacturing the bottom gate type thin film transistor according to claim 1, wherein the gate insulating film and the oxide semiconductor active layer are formed by a sputter method using targets for the gate insulating film and targets for the semiconductor active layer which are placed so that the film formation roll faces both the targets.

3. The method for manufacturing a bottom gate type thin film transistor according to claim 1, wherein the flexible plastic substrate can be cooled or heated by the film formation roll at the time of a film formation.

4. The method for manufacturing a bottom gate type thin film transistor according to claim 1, wherein the gate insulating film and the oxide semiconductor active layer are formed under conditions of independent gas pressures.

5. The method for manufacturing a bottom gate type thin film transistor according to claim 1, wherein a taking-out part of a scanning electrode and a signal electrode is covered by forming a masking thin film of a resist on the flexible plastic substrate before the gate insulating film and the semiconductor active layer are formed.

6. The method for manufacturing a bottom gate type thin film transistor according to claim 1, wherein the gate insulating film and the oxide semiconductor active layer are formed in this order with the film formation roll rotated.

7. A method for manufacturing a bottom gate type thin film transistor having a gate electrode, a gate insulating film, an oxide semiconductor active layer, a source electrode and a drain electrode on a flexible plastic substrate of a supporting substrate, comprising:

continuously forming the gate insulating film and the oxide semiconductor active layer on the flexible plastic substrate with the gate electrode inside a vacuum film formation chamber of a film formation apparatus, the apparatus being a type of continuously winding up the roll-shaped substrate, and the gate insulating film and the oxide semiconductor active layer formed without being exposed to air, arranging the flexible plastic substrate on a turn film formation roll in the vacuum film formation chamber, and forming the gate insulating film and the oxide semiconductor active layer on the film formation roll, wherein the gate insulating film and the oxide semiconductor active layer are formed by a sputter method using targets for the gate insulating film and targets for the semiconductor active layer which are placed so that the film formation roll faces both the targets, wherein the flexible plastic substrate can be cooled or heated by the film formation roll at the time of a film formation wherein the gate insulating film and the oxide semiconductor active layer are formed under conditions of independent gas pressures, wherein a taking-out part of a scanning electrode and a signal electrode is covered by forming a masking thin film of a resist on the flexible plastic substrate before the gate insulating film and the semiconductor active layer are formed, wherein the gate insulating film and the oxide semiconductor active layer are formed in this order with the film formation roll rotated, wherein targets for the gate insulating film and targets for the semiconductor active layer respectively have a plurality of targets, and wherein the number of the targets for the gate insulating film is more than the number of the targets for the semiconductor active layer.

* * * * *